United States Patent
Ito et al.

[11] Patent Number: 6,121,625
[45] Date of Patent: Sep. 19, 2000

[54] CHARGED PARTICLE BEAM LITHOGRAPHY APPARATUS FOR FORMING PATTERN ON SEMICONDUCTOR

[75] Inventors: Hiroyuki Ito, Hitachinaka; Yasunari Sohda, Hachioji; Yasuhiro Someda, Kokubunji; Yoshinori Nakayama, Sayama; Masahide Okumura, Sagamihara; Hidetoshi Satoh, Hachioji, all of Japan

[73] Assignee: Hitachi, Ltd., Tokyo, Japan

[21] Appl. No.: 09/087,296

[22] Filed: May 29, 1998

[30] Foreign Application Priority Data

May 30, 1997 [JP] Japan .................................. 9-141381

[51] Int. Cl.⁷ .................................................. H01J 37/304
[52] U.S. Cl. .................................................. 250/492.22
[58] Field of Search ....................... 250/492.22, 492.23, 250/505.1

[56] References Cited

U.S. PATENT DOCUMENTS 5,932,884  8/1999  Aizaki ........................... 250/492.22

FOREIGN PATENT DOCUMENTS 4100208A  4/1992  Japan .
6163377A  6/1994  Japan .
7183191A  7/1995  Japan .

*Primary Examiner*—Kiet T. Nguyen
*Attorney, Agent, or Firm*—Kenyon & Kenyon

[57] ABSTRACT

In order to provide a high-speed and high accuracy cell projection exposure apparatus which increases a pattern projection number extremely, a plurality of stencil masks mounting a transferal aperture and a transmission aperture are provided and are positioned by a drive stage, the electron beam passes through a transmission aperture of other stencil masks while selecting the aperture on a stencil mask with a beam deflection device, the transmission aperture is provided for a mask transfer direction in succession, the stencil mask is moved while being transmitted with the beam, and other stencil mask transfer is executed when specified stencil mask aperture group is exposed. These operations are repeated so that all exposure processes are performed.

11 Claims, 8 Drawing Sheets

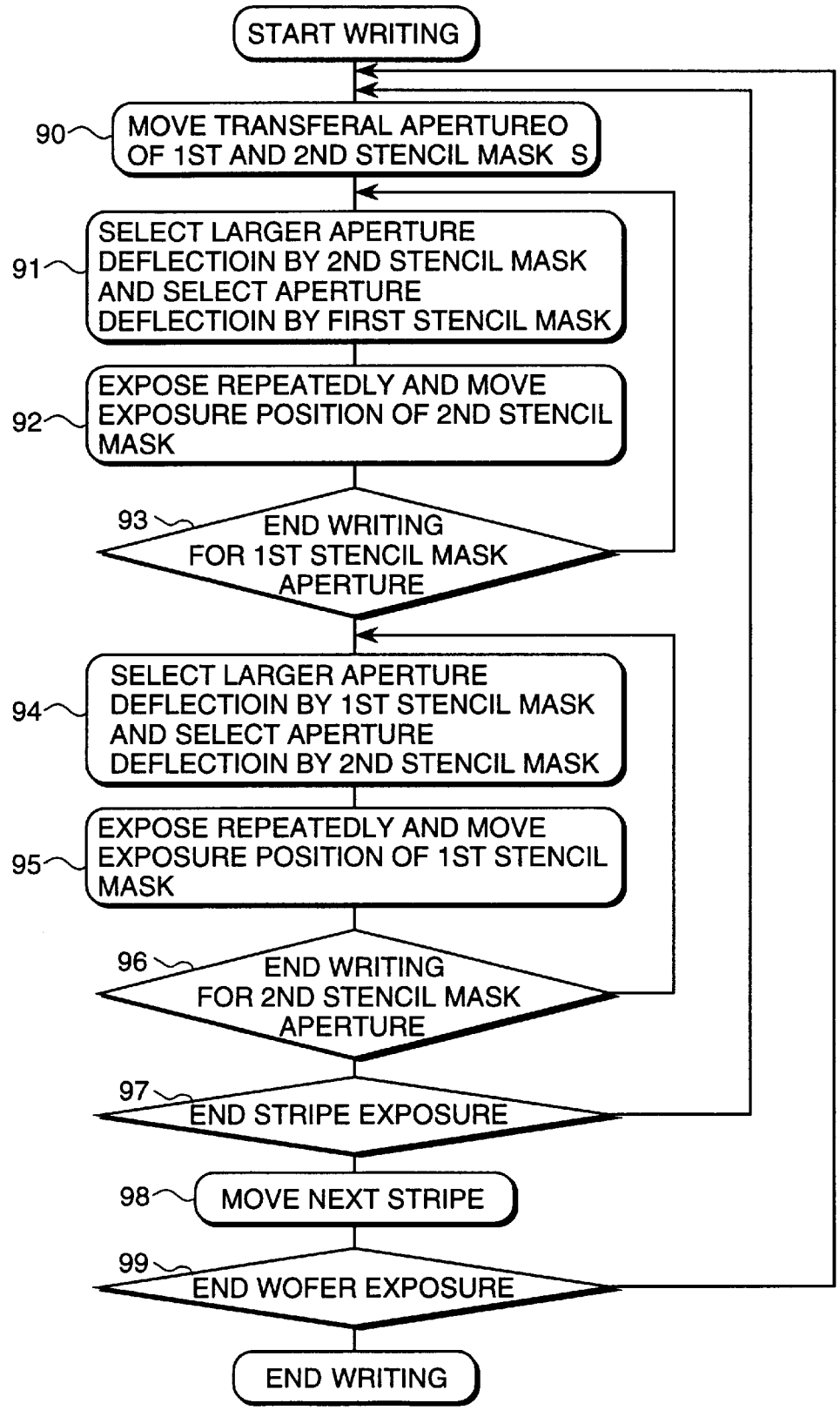

CHARGED PARTICLE BEAM LITHOGRAPHY APPARATUS FOR FORMING PATTERN ON SEMI-CONDUCTOR

BACKGROUND OF THE INVENTION

The present invention relates to a charged particle beam lithography apparatus for forming a pattern on a semiconductor memory by utilizing a charged particle beam, and relates to a projection mask used for said charged particle beam lithography apparatus.

A conventional charged particle beam lithography apparatus, especially an electron beam lithography apparatus is used for research and development as an exposure apparatus for exposing a minute pattern referring to its high resolution. In the mass-production of the devices however, throughput of the charged particle beam lithography apparatus is low compared with that of an optical exposure apparatus, and the cost performance thereof is inferior.

Late years, a cell projection exposure method by which patterns are repeatedly loaded on a stencil mask beforehand, and the exposure is performed in a high reduction rate by deflecting optically so as to select the pattern, attracts attention. For example, such method is indicated in Japanese Patent Laid-open No. 6-163377. As in this cell projection exposure method, the complicated shape patterns are exposed together, a shot number is reduced largely, and high throughput may be obtained.

Furthermore, this cell projection exposure method is possible to expose in high accuracy too, because there is not a measurement setting error (by location gap of mask) as in a variable shaped beam type exposure beam formation method (Japanese Patent Laid-open No. 4-100208), in which the pattern that should be exposed is formed by overlapping two or more masks.

However, the cell projection exposure method has a problem as that only several ten patterns having exposure area of practically used several um are obtained to be selected. In order to increase the pattern number, a complicated pattern selecting deflection system which is capable to be deflected with a great angle becomes to be needed, furthermore, there is a problem in accuracy such as distortion of a stencil pattern and deterioration of matching accuracy and switching accuracy between mutual figures, because of aberration by an optical separating axis, deflection response, and increase of drift.

Moreover on a mask board top, in order to form a pattern which exceeds a selection range of the optical system, a drive mechanism as indicated in Japanese Patent Laid-open No. 7-183191 may be arranged, it takes an enough time for selecting the pattern by driving the mechanism, and there arises a problem in order to obtain the high throughput.

SUMMARY OF THE INVENTION

An object of the present invention is to solve the problems stated above and is to provide a charged particle beam lithography apparatus which remarkably increases the pattern number which can be selected by a cell projection exposure method and is capable to realize the high throughput.

In order to solve the problems stated above, a charged particle beam lithography apparatus in the present invention comprises a charged particle source to generate a charged particle beam, and a plurality of stencil masks which respectively have several transferal apertures generating patterns which should be projected on a specimen by a charged particle beam from the charged particle source. Thereby, in the case when projection is performed by a transferal aperture of at least one of the stencil mask among said several stencil masks, the charged particle beam is irradiated on the specimen passing through outside of the transferal aperture of other stencil masks among the several stencil masks.

According to the constitution of the charged particle beam lithography apparatus stated above, it becomes possible to provide a plurality of stencil masks respectively having plural transferal apertures. Moreover there is no affection by the measurement setting error of the stencil mask arranged in several steps too, and a lot of transferal apertures becomes possible to be provided in high accuracy.

Moreover, as a constitution to realize a more concrete embodiment of the present invention, a transfer mechanism to transfer the stencil mask and a control part which controls a charged particle beam deflector arranged in a circumference of an optical path of the transfer mechanism and the charged particle beam, are provided.

Furthermore, according to the present invention, a control part for controlling the transfer mechanism is provided, and said control part moves an exposure location of the charged particle beam toward the transferal aperture of the other stencil masks when the charged particle beam is irradiated relating to the transferal apertures of one or more stencil mask.

Even if the stencil masks are provided in several steps, a continuous writing using the plural transferal apertures may be realized in high throughput.

Moreover, because this transfer is performed by the transfer mechanism while the charged particle beam is positioned outside of a transmission aperture or the stencil mask, other stencil masks may be projected before the next writing during the pictures are written by at least one of the stencil mask.

As a transmission aperture is formed along the sequence of the transferal aperture formed on the stencil mask furthermore, the exposure location of the charged particle beam moves to the neighborhood of the transferal aperture which should be projected (or moves until said transferal aperture enters in a deflection range of the charged particle beam) before the stencil mask moves, thereby, it becomes possible to position the exposure location of the charged particle beam in the transferal aperture immediately when the projection is performed by using the transferal aperture.

Moreover, the plural stencil masks may be provided at an equal height to an optical axis of charged particle beam. In this case, when patterns are written by the transferal aperture of one of the stencil masks, the transfer mechanism is controlled so as to position the transferal aperture of the other stencil masks in the deflection range of the deflector of the charged particle beam. Thereby, after the writing by the transferal aperture of one of the stencil mask is finished, the writing by next transferal aperture becomes possible to be done immediately, and many transferal apertures may be provided while maintaining high throughput.

As stated above, the stencil masks arranged in several steps (or plural stencil masks in the same height) are provided, are positioned by the transfer mechanism, and expose the transferal apertures on the stencil masks successively.

Moreover in order to realize the high throughput, when selectively exposing the specified stencil mask aperture group by the cell projection deflector, the charged particle beam transmits the non-screening parts of the other stencil"

mask (the transmission aperture). Here, the stencil mask non-screening parts are provided in succession towards a mask transfer direction, the other stencil mask are executed to be transferred when exposing the specified stencil mask aperture group while letting the beam transmit. The above stated operations are repeated, thereby the exposure is controlled to complete. According to the above stated constitution of the present invention, it becomes possible to reduce the transit time by the transfer mechanism which takes much time comparing with the exposure location transfer of the charged particle beam by the charged particle deflector, and to expose continually by the cell projection exposure method.

The number of the apertures which are capable to be used in the present invention is limited by the product of the transferal aperture number of the stencil masks and the stencil mask number. For example, usual reduction rate is about one per several ten, and size of the stencil mask aperture to realize a cell projection exposure method of several $\mu$m is 100 $\mu$m around. Accordingly when the transferal aperture is loaded by an occupation rate of 10%, it becomes possible to select 1000 apertures with the stencil mask of 10 mm square. If plural stencil masks are arranged, it becomes possible to mount several thousand exposure apertures by the cell projection method.

Figure 3:
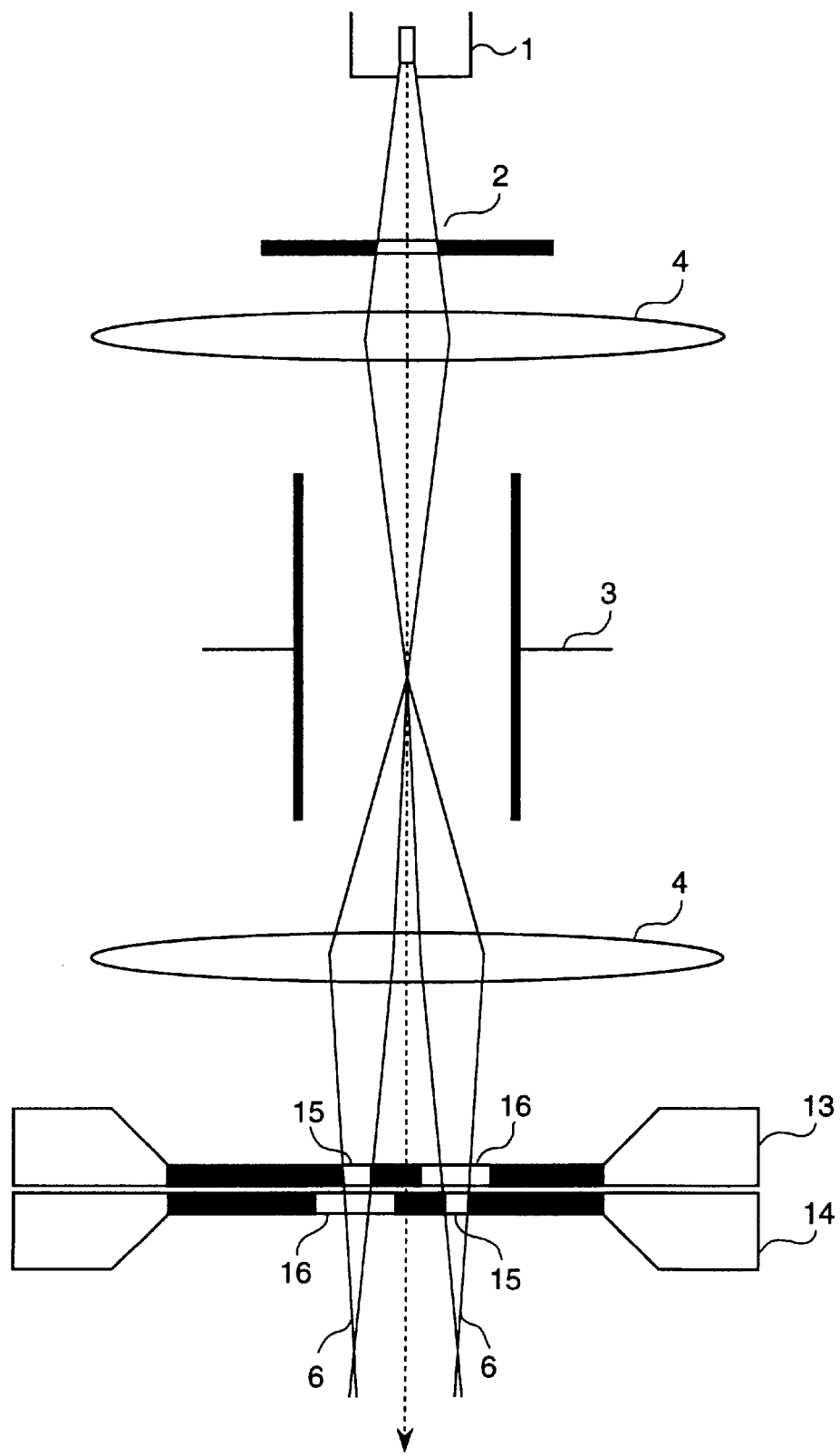
FIG. 3 is an illustrative view to explain the other embodiment of the present invention.
Figure 4:
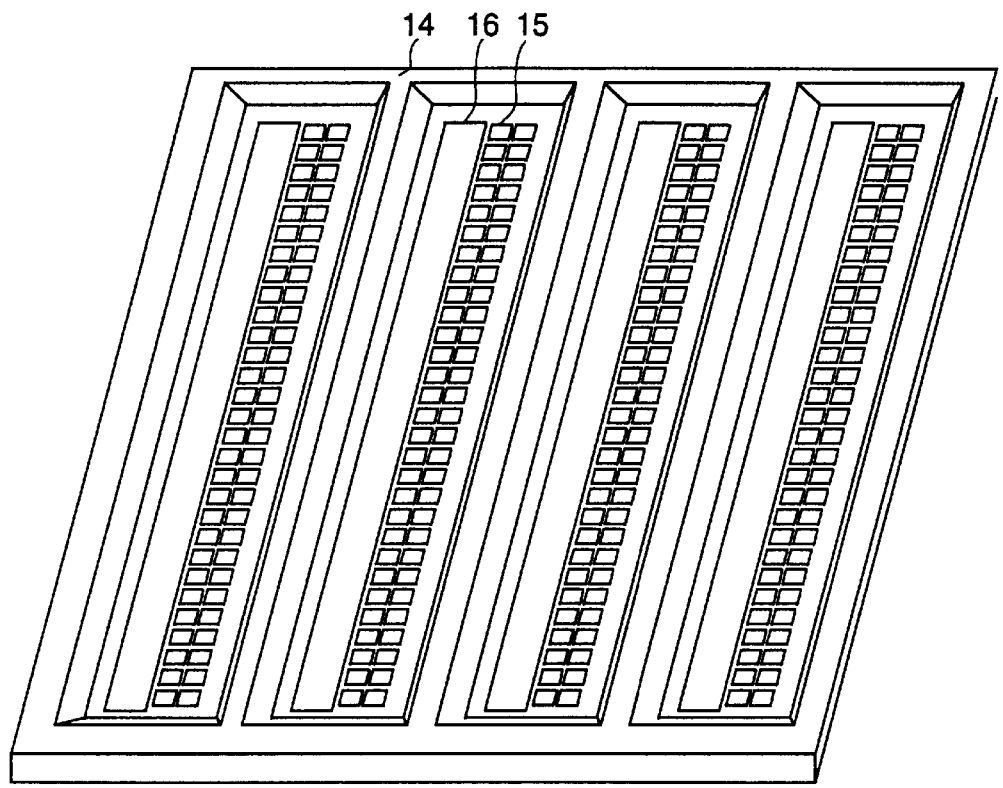

The FIG. 4 shows an example of the stencil mask shown in FIG. 3 in the present invention.

Figure 5:
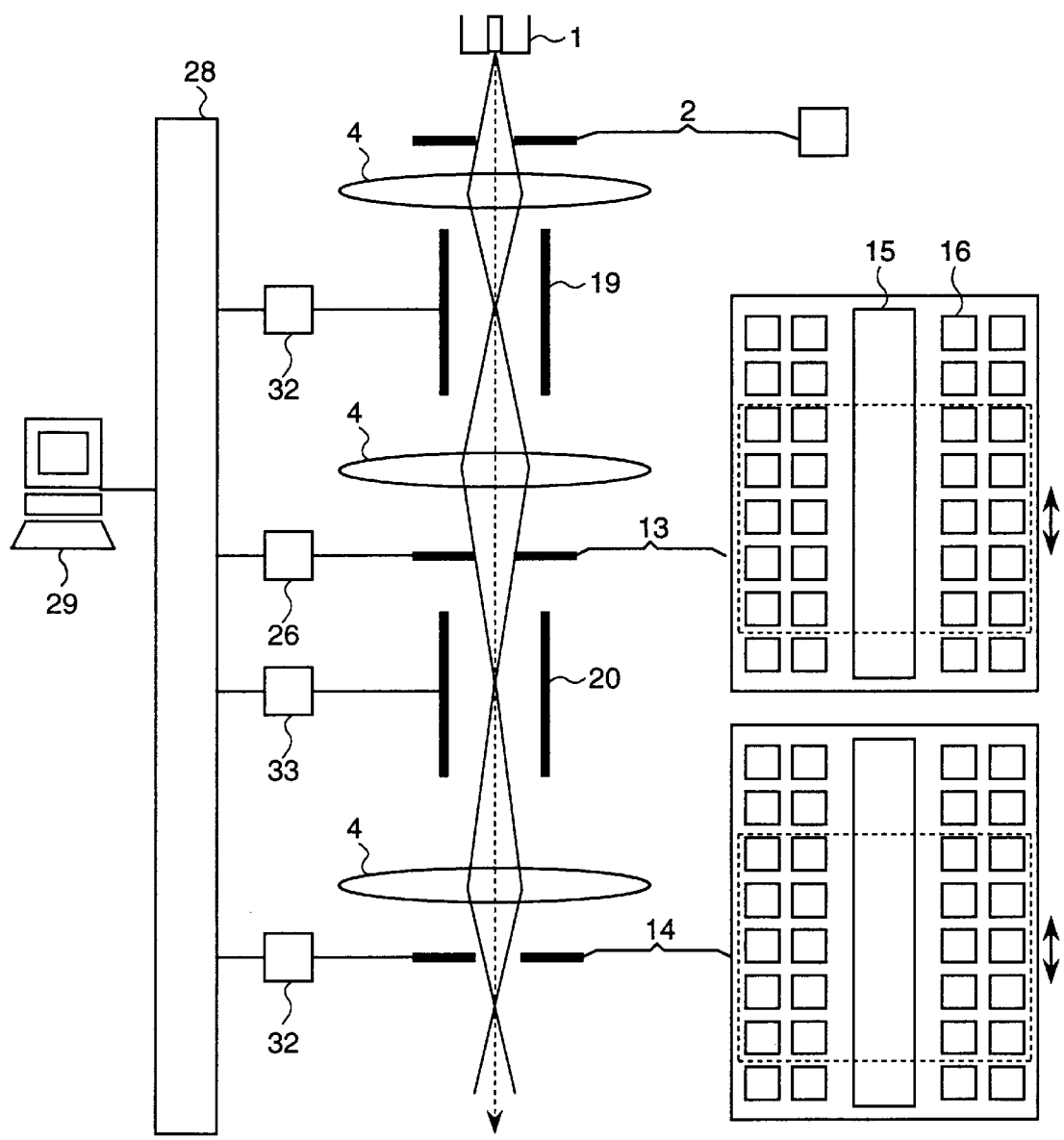

The FIG. 5 shows an other embodiment in the present invention.

Figure 6:
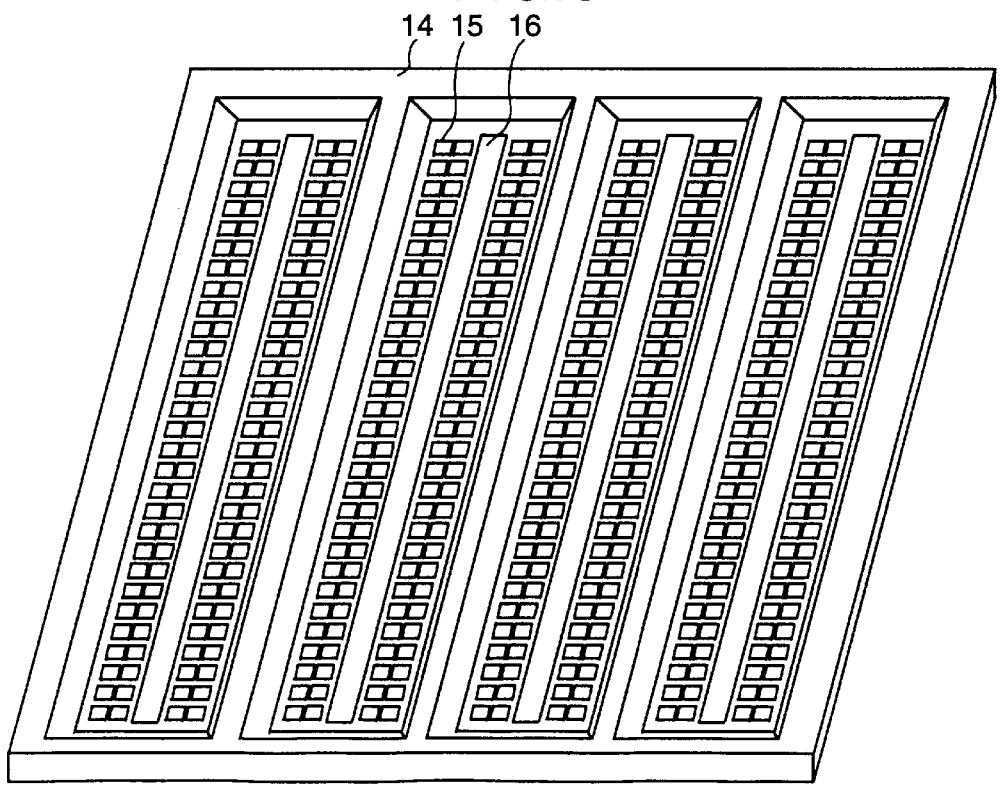

The FIG. 6 shows an example of the stencil mask shown in FIG. 5 in the present invention.

Figure 7:
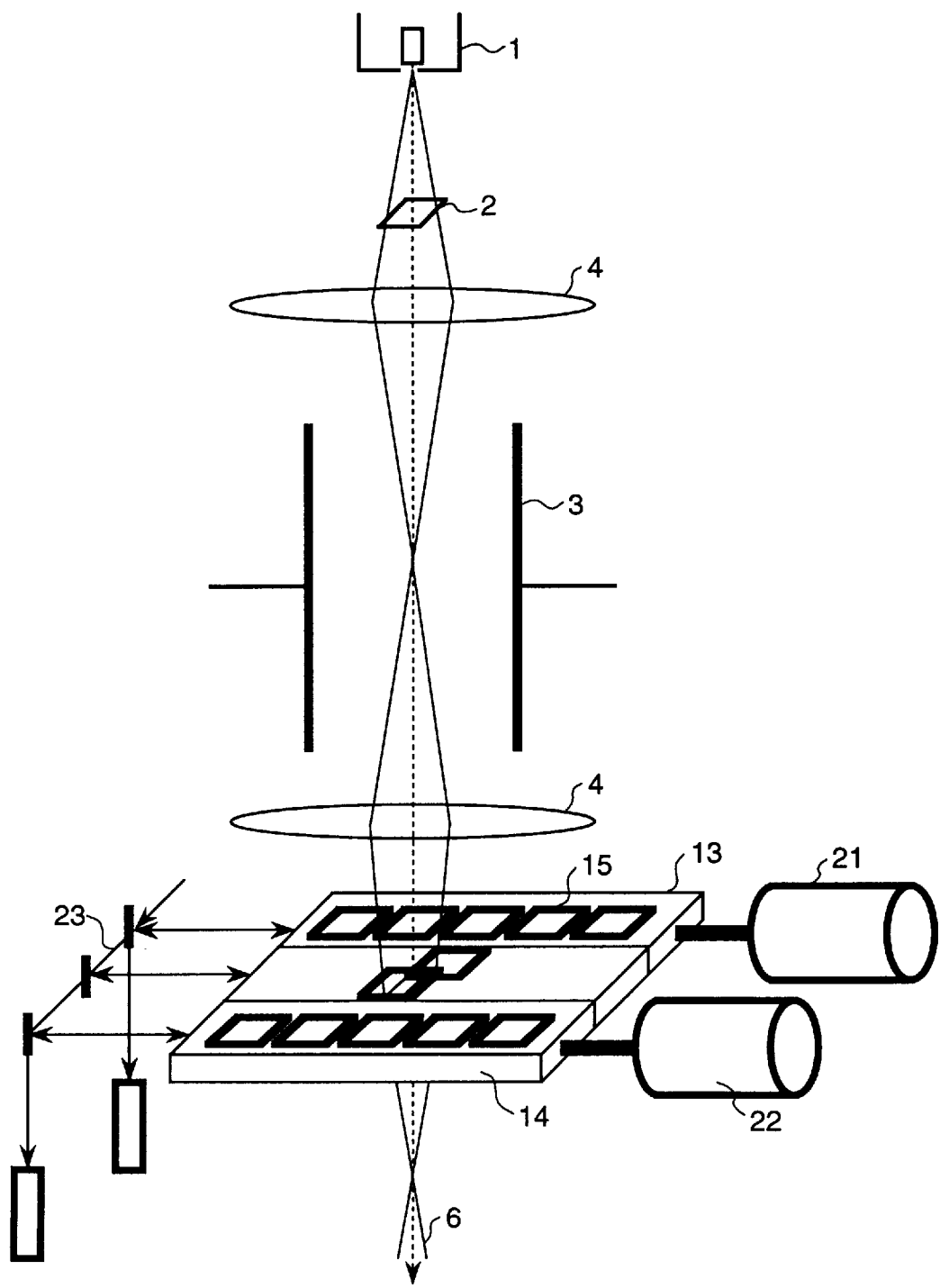

The FIG. 7 shows an other embodiment further in the present invention.

Figure 8:
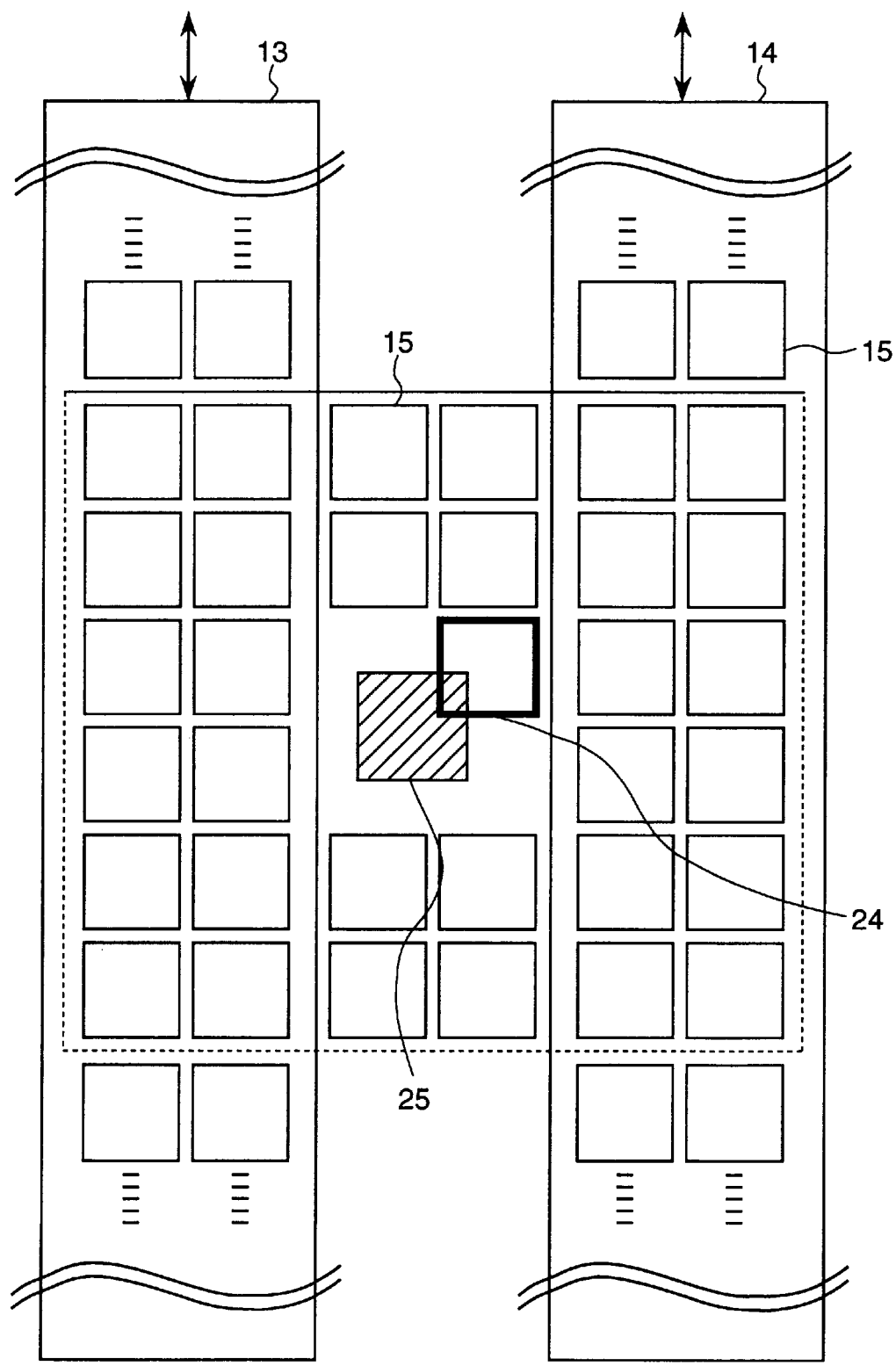

The FIG. 8 shows an example of the stencil mask shown in FIG. 7 in the present invention.

FIG. 9 show a flow chart which shows an operation example in the present invention.

DETAILED DESCRIPTION OF THE PREFERRED EMBODIMENTS

Figure 1:
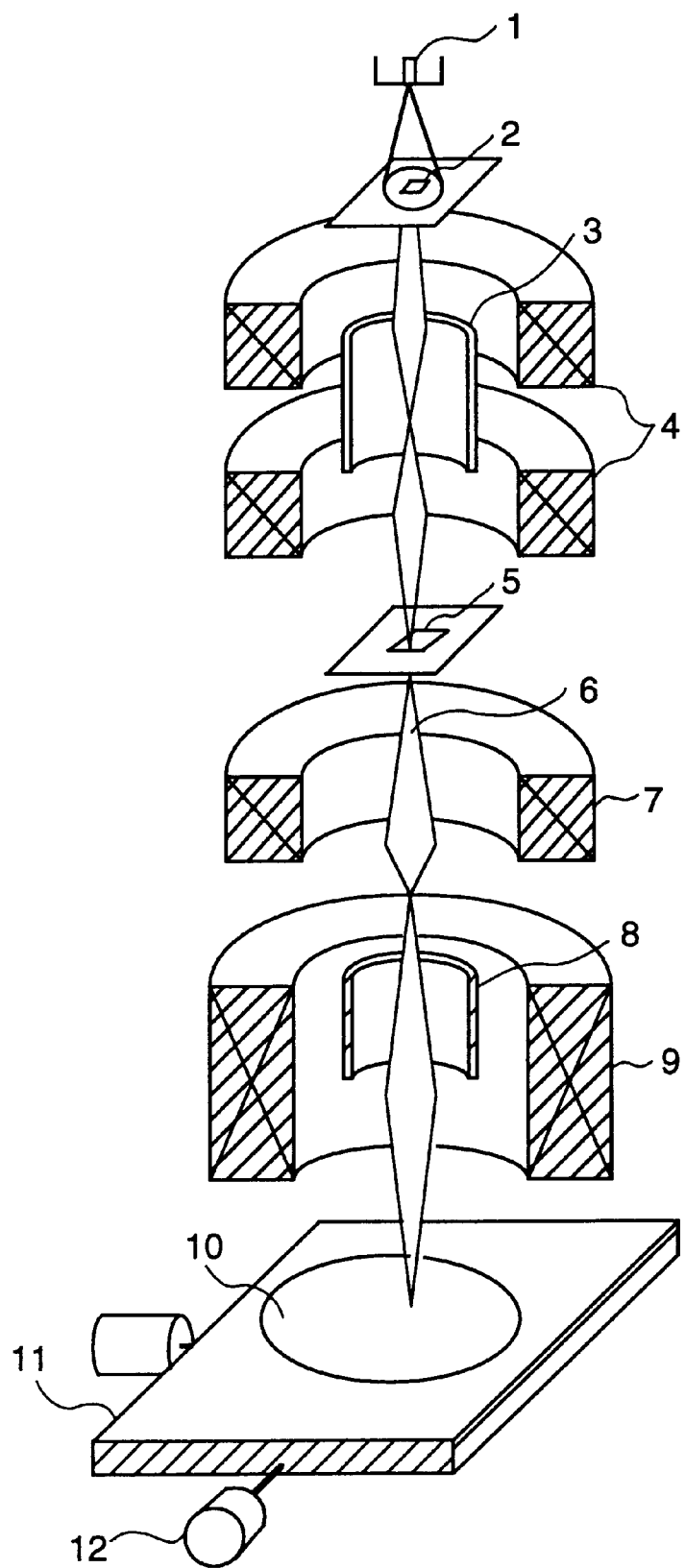
FIG. 1 is an illustrative view to explain the present invention.

FIG. 1 is a constitutional view of a variable shaped beam type electron beam lithography apparatus.

The electron beam that is irradiated from an electronic source 1 generally passes through a limiting aperture 2 having a rectangular shape focuses on a stencil mask 5 by a shaping lens 4. A variable rectangle aperture and an aperture used for a cell projection exposure method are arranged on the stencil mask 5, and they are selected by an electron beam deflection of a cell projection deflector 3. The electron beam which has transmitted through an aperture on the stencil mask 5 so as to form a shaping beam 6, and is projected on a silicon wafer 10 so as to be reduced in a size of one per several ten by a reduction lens 7 and an objective lens 9 Projection location onto the silicon wafer 10 is designated by a beam deflection with an objective deflector 8 and by positioning a stage 11 with a drive system 12. Here, a transferal aperture number which is capable to be exposed is limited by an electronic optical aberration and an output of a control circuit.

Figure 2:
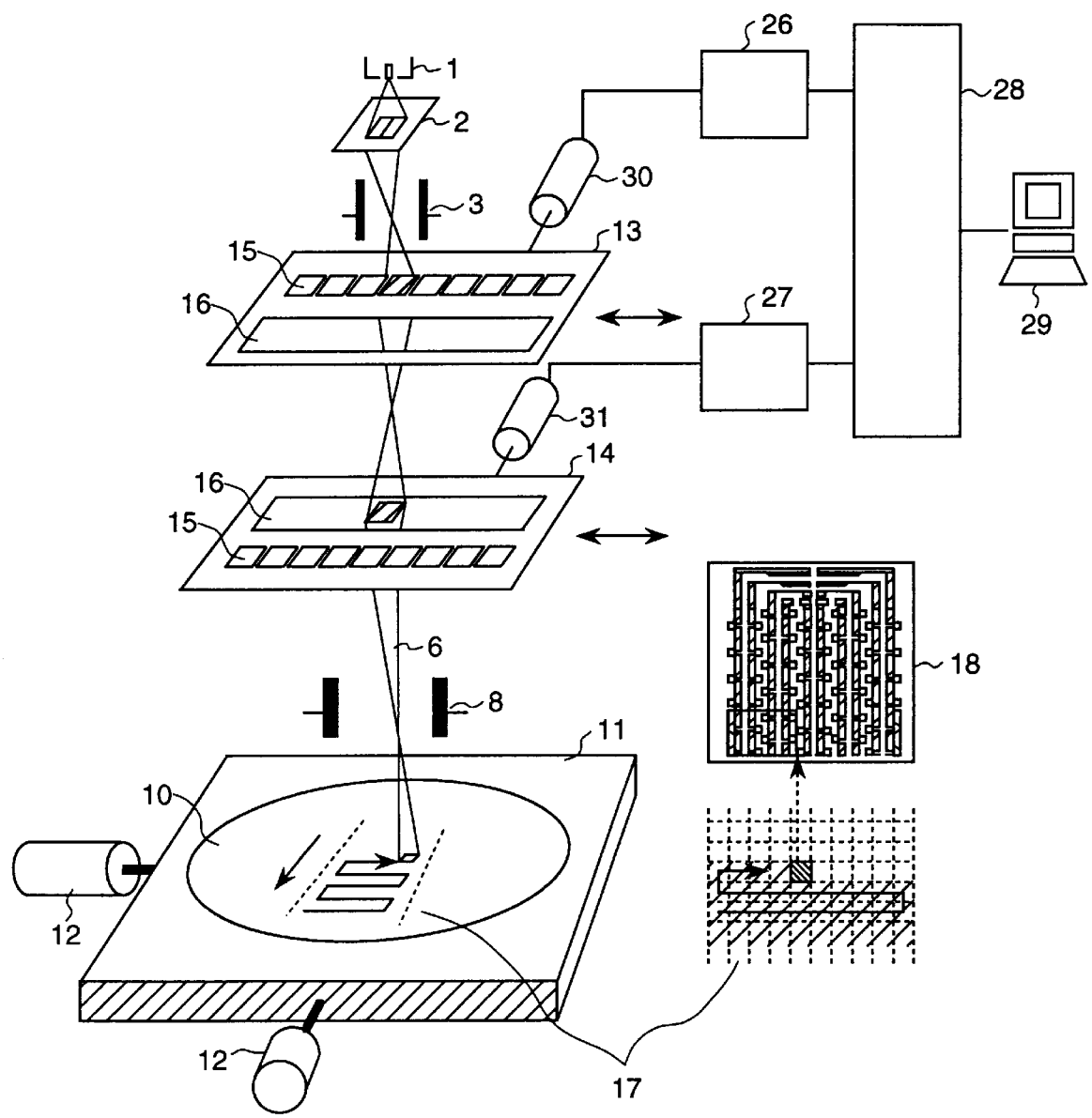
FIG. 2 shows an embodiment of the present invention.

FIG. 2 is a figure to show a principle of the present invention for increasing the transferal aperture number which may be used remarkably. The electron beam irradiated from the electronic source 1 passes through a limiting aperture 2, and focuses on a first stencil mask 13 and a second stencil mask 14 which are movable independently and mechanically. In FIG. 2, although the stencil masks are arranged in two steps, however they are capable to be arranged in three steps or more. Moreover the shaping lens etc. are omitted in FIG. 2. In the same way as in FIG. 1, a transferal aperture 15 for the cell projection exposure method including an aperture for a variable rectangle is arranged on the stencil mask. The transferal aperture 15 and the transmission aperture 16 are formed along a transfer direction of the stencil mask, and is arranged in a beam deflection range of the cell projection deflector 3. In the writing, a desired aperture is selected from a plural transferal apertures group in the deflection range by cell projection deflector 3. When either transferal aperture 15 of the first stencil mask 13 and the second stencil mask 14 is selected, it is set up so that an exposure location of the electron beam is positioned to the transmission aperture 16 of the other stencil mask.

In order to reduce a transfer dead time here, while the transferal aperture 15 of an either stencil mask is selectively exposed, the beam transmits to the transmission aperture 16 of the other stencil mask and at the same time moves to the next exposure location. By repeating the above-mentioned operation, it becomes possible to selectively expose a lot of transferal apertures 15.

In the same way as FIG. 1, a high-speed writing is realized by positioning the shaping beam 6 transmitted through the transferal aperture 15 provided on the second stencil mask 14, on the silicon wafer 10 by the objective deflector 8 and the stage 11. The transferal aperture 15 is arranged according to a writing order of the exposure pattern 18, and the transmission aperture 16 is formed in succession to a transfer direction. That is, in an electron beam lithography apparatus by a continuation transfer system, the exposure pattern 18 is divided so as to be exposed successively on an exposure stripe 17 in a deflection width of objective deflector 8. The stencil mask aperture may be effectively moved by arranging the transferal aperture 15 in the writing order.

In this way, as the transferal aperture 15 is arranged in a line or few lines, furthermore, the transmission aperture 16 is arranged along the sequence (line or lines), if the stencil masks of several steps are provided, a high throughput becomes possible to be realized. This is because the exposure location of the electron beam is capable to move to neighborhood of the transferal aperture which should be used in the next among the transferal aperture except the stencil mask used for the projection.

Furthermore, as for the transmission aperture 16 is continually formed along the sequence which the transferal aperture 15 forms, the electron beam is not intercepted while being projected. By transferring in this way, a change of the transferal aperture becomes possible to be operated immediately.

As shown in FIG. 2 in this description in addition to above, the stencil mask in which the transferal aperture is formed laterally in longer is explained as an example, however, there is no need to always let the exposure location move by using the transmission aperture 16 in the case using such a stencil mask as above, and the beam may be transferred to the next exposure location while letting the beam transmitted outside space of the stencil mask, for example. Because, the stencil mask is formed along the arrangement of the transferal aperture in the outside space of the stencil mask in the same way as the transferal aperture, an effect similar to that obtained when the transmission aperture is used, may be obtained.

In the example shown in FIG. 2 in addition to above, transfer mechanisms 30, 31 are respectively provided on the first stencil mask 13 and the second stencil mask 14, and support them so as to make them movable to a horizontal direction shown by arrows of FIG. 2. As for the transfer mechanisms 30, 31, transfer control parts 26, 27 are respectively provided, and they supplies signals to the transfer mechanism 30, 31 so as to drive them according to a transfer quantity thereof based on a stencil mask transfer command from a control computer 28.

Moreover, in FIG. 2, the transfer mechanism is shown so as to move to only the direction shown by an arrow, however, the direction is not limited to this direction. For example, as the transfer mechanism to transfer the electron beam between the transferal aperture 15 and the transmission aperture 16, a transfer mechanism to move the stencil mask to a vertical direction being vertical to the arrow may be provided. Moreover, this transfer mechanism may be used to transfer between the transferal apertures of the stencil mask formed two lines or more transferal apertures.

Furthermore, in the following explanatory drawings, the size and the arrangement of the aperture is shown by being fixed, however it is self-evident that it may be variable according to the exposure pattern 18. For example, when the repeating pattern that should be exposed is bigger than the limiting aperture 2, the transferal aperture 15 is scanned over with the cell projection deflector 3, and the other pertinence transmission aperture 16 may be magnified than the exposure range. Moreover, when the repeating pattern is partially more minute than the limiting aperture, if the transferal aperture 15 of the first stencil mask 13 arranged on an upper line is used as the limiting aperture the transferal aperture size of the second stencil mask 14 arranged on an lower line may be reduced so as to increase the number of the aperture.

FIGS. 3 to 8 show the embodiments of the present invention. FIG. 3 is an example in which the first stencil mask 13 and the second stencil mask 14 shown in FIG. 2 is arranged to establish a gap within the depth of focus. Generally, an incidence angle of the electron beam lithography apparatus is small on the specimen side so as to be in a depth of focus of several 10 $\mu$m. As having a reduction optical system furthermore, the location margin of the stencil mask in the optical axis direction thereof is about several 100 $\mu$m, and it is easy to dispose them closely. When it is not easy to dispose them closely because of any other condition, it is possible to move mutually by inserting an electron lens between the first stencil mask 13 and the second stencil mask 14. A stencil mask example to be used in this embodiment is shown by FIG. 4.

FIG. 4 show an example in which the transferal aperture 15 and the transmission aperture 16 are arranged closely in few lines. Each aperture size may be adjusted finely according to the transferal aperture size. This stencil mask may be produced by a usual silicon mask process. That is, after having formed the aperture by a dry etching method on the silicon surface, a thin film is formed by a back etching method from a reverse face of the silicon. According to this production method, the lib structure for obtaining needed strength security and thermal diffusion may be formed easily, it becomes possible to form several aperture groups which may be selected continuously as shown in FIG. 4

FIG. 5 is an example in the present invention in which a first cell projection deflector 19 and a second cell projection deflector 20 are respectively provided between the limiting aperture, the first stencil mask 13 and the second stencil mask 14 in FIG. 2. Moreover, the deflection control parts 32,33 are respectively provided to these deflectors, the signal is supplied in the first cell projection deflector 19 and the second cell projection deflector 20 so as to apply a voltage according to a deflection quantity based on a deflection command of the electron beam from the control computer 28. The selective degree of freedom is improved furthermore by providing the second cell projection deflector 20. The patterns which is capable to be selected by the deflection are increased in double as shown the deflection range of the projection deflection in dotted lines of FIG. 5 compared with that in FIG. 3.

An example of the stencil mask used in this embodiment is shown in FIG. 6. FIG. 6 shows an example same as FIG. 4 in which the transferal aperture 15 and transmission aperture 16 are arranged closely in several lines. Aperture selection by the deflection and mechanical aperture transfer are repeated in the writing sequence with the mutual stencil mask.

FIG. 7 shows an example in which the first parallels stencil mask 13 driven by the first projection drive system 21 and the second projection drive system 22 independently driven by the second stencil mask 14 are moved in parallel. The control system is omitted in this figure.

Stencil mask configuration example to use with this embodiment is shown by FIG. 8. FIG. 8 shows an example in which a variable rectangular aperture 24 used frequently and a transferal aperture 15 appearing frequently as a fixed location, and a transferal aperture 15 are arranged closely in several lines. Because the transmission aperture is unnecessary in this embodiment, the stencil mask may be miniaturized. The aperture selection performed by deflection in the writing sequence, and the mechanical aperture transfer is repeated by a mutual stencil mask. The mechanical transfer is capable to be performed by one axes position control by using the laser measuring system 23 etc., and when the rotation error in the projection drive is big, a position control system more than 2 axes is applied. In any event, an error of the positioning may be revised by the beam deflection system easily because of its high reduction rate. Moreover, the selective deflection range may be reduced and it is arranged with the writing sequence reasonably furthermore, a large beam deflection being disadvantageous in accuracy may be prevented and stabilization of the exposure location accuracy is possible to be obtained, too. Moreover, the time zone while the projection by one stencil mask is performed, may be used in the transit time of the other stencil mask, thereby the transit time may be reduced.

FIG. 9 is a flow chart of the writing process by the constitution shown by FIG. 5 and FIG. 6.

Starting the writing, the mask stage moves so that the shaping beam 6 is positioned in the transferal aperture of the first stencil mask and the transmission aperture of the second stencil mask (step 90 in FIG. 9). In FIG. 5, the transfer mechanism is omitted.

The displacement from the objective location of the mask stage location is measured by a stage location measuring means such as a laser coordinate measuring apparatus etc. (it is not illustrated in the figure), and it is fed back to the cell projection deflector or the objective deflector in the writing.

That is, on the basis of the measured mask stage location error, the exposure location of injection location and specimen surface to the aperture illumination location of the first stencil mask and the second stencil mask transmission aperture are revised at high speed by respectively the first cell projection deflector 19, the second cell projection deflector 20 and the objective deflector step 91 in FIG. 9).

Corresponding to the exposure pattern signal from the control part 28, and based on the transferal aperture position information memorized beforehand, the first cell projection deflector 19 selects a transferal aperture on the first stencil mask 13, and the exposure of the wafer is performed repeatedly. Here, the transferal aperture is selected and exposed in a dotted line department of the first stencil mask 13 as a selective range of the first cell projection deflector 19 (when the stencil mask is not projected).

While exposing the first stencil mask aperture, the second stencil mask 14 is moved toward the next exposure planned transferal aperture without passing trough the transmitting aperture edge. That is, while the beam is positioned in the transmission aperture 16 (so that the second stencil mask 14 does not disturb orbit of the beam), the second stencil mask 14 moves by the transfer mechanism(steps 92 to 93 in FIG. 9). Then, the transferal aperture having a pattern which should be exposed in the next, stops to move at a point in time that is positioned in a selective range of the second cell projection deflector 20 (dotted line department) (steps 94 to 96 in FIG. 9).

Every stencil mask stopping errors are solved easily by correcting the mask stage location measurement system to the every deflection systems. Because if the selective range by the deflection device is fitted to the location of the transferal aperture which should be projected in the next at least, even if the transfer by the transfer mechanism is not completed or it is projected over, it may be revised in suitable by transferring the exposure location of the charged particle beam by the deflection device.

As a concrete constitution for it, it may be proposed a means for determining a control output supplied to the deflection device based on deficiency or excess of the transfer provided as the position information of the stage from said stage location measurement means. Moreover the timing that provides such an operation may be not only the case for the correction of the location error mentioned above, but the case as follows, For example, when the projection by the first stencil mask 13 is completed before the location transfer of the second stencil mask 14 is completed, the time during the transfer of the second stencil mask 14 after that, becomes to be the time zone not to be projected. In order to eliminate this time zones a little, even if it is before the transfer of the stencil mask is completed, the projection may be started when the transferal aperture having the pattern which should be projected in the next is positioned in the deflection range of the charged particle beam.

Here, the transfer into a deflection region of each mask stage is detected by a function for measuring the mask stage coordinate, and the mechanical location thereof is revised with the deflection system, thereby the exposure is capable to be started without always completing the movement of the mask stage to the deflection center. The mechanical transit time may be shortened as stated above. Moreover, as the deflector is capable to be operated extremely at high speed, the mask stage is controlled to be moved continuously with a speed in inversely proportional to the exposure number (exposure time) by the aperture, the measurement location data is corrected with a real time, and it is possible to continuously transfer the mask stage so as to make the waiting time for the stage transfer minimum.

Based on the condition as stated above, the exposure is repeated, or the projection exposure of the transferal aperture 15 of the second stencil mask 14 is repeated after finishing the transfer to the range capable to be exposed of the second stencil mask 14, and the chip or the stripe finish to be exposed(step 97 to 99 in FIG. 9).

In order to expose with a high throughput as stated above, it is preferable to arrange the transferal aperture on the stencil mask in an exposing order. Concretely, preparing the transferal aperture having a projection pattern to be exposed in a selected range of the cell projection deflector in succession, the stencil mask is changed at a time point when the projection by those transferal apertures has finished once. Moreover, relating to the order to write the wafer, the wafer stage is moved to be exposed in a direction to make a substitution number of the aperture projection fewer, thereby the number of the apertures may be reduced, too.

The transit time of the transfer mechanism may be proposed to be reduced as one condition to get high throughput. Stepping motors are used for the transfer mechanism generally, however it takes about 100 ms transit time which is almost 100000 times is needed comparing with an exposure location transit time of 1 us of the electron beam by the deflecting electrode, and the throughput differs greatly depending on how the time is eliminated.

In order to improve the throughput in this embodiment, the other stencil mask is moved by the transfer mechanism while the projection is performed by the other stencil mask, thereby the transit time by the transfer mechanism is reduced and high throughput is realized. Moreover, it is one means to reduce the transit time by the transfer mechanism to supplement a transfer location error of the transfer mechanism stated above by the deflector.

Ideally, if the transfer of the other stencil mask is completed during the projection with a stencil mask of the other, it becomes possible to substantially save the moving time of the transfer mechanism.

Moreover, the arrangement of the transferal aperture of the stencil mask will be assigned to each stencil mask according to the transferal aperture group (deflection range of the deflector for example) so that the other stencil mask is capable to move while the stencil mask of the other is exposed.

According to the present invention as stated above, as size setting error does not occur even if several stencil masks are provided, A lot of transferal apertures may be provided in a high accuracy, and the number of the patterns to be exposed together becomes possible to be greatly increased.

Moreover as the time for selecting the transferal aperture of the plural stencil masks may be reduced, it becomes possible to improve the throughput.

Moreover, it becomes possible to be used in a logic circuit which is partially exposed together with a few patterns to be repeated. Moreover, the exposure location accuracy is possible to be performed in stable too because the selective deflection range is reduced.

What is claimed is:

1. A charged particle beam lithography apparatus comprising:

a charged particle source to generate a charged particle beam, a plurality of stencil masks, each having several transferal apertures for respectively generating patterns to be projected on a specimen surface by said charged particle beam from said charged particle source, at least one of said stencil masks being formed so as to include a transmission aperture, a transfer mechanism to move said stencil masks, and a control part for controlling said transfer mechanism and a charged particle beam deflector provided on a circumference of a path of said charged particle beam so that said charged particle beam is irradiated on said specimen surface through said transmission aperture of said at least one stencil mask while said charged particle beam also projects through a transferal aperture of another of said stencil masks.

2. A charged particle beam lithography apparatus as defined in claim 1, wherein characterized by further comprising a plurality of transferal apertures provided on said stencil mask so as to be exposed together.

3. A charged particle beam lithography apparatus as defined in claim 1, wherein characterized in that said plural transferal apertures are arranged on said stencil mask.

4. A charged particle beam lithography apparatus as defined in claim 3, wherein characterized by further comprising a transmission port formed along said transferal apertures for being transmitted by said charged particle beam.

5. A charged particle beam lithography apparatus as defined in claim 1, wherein characterized in that said control part controls said transfer mechanism to move said other stencil mask, while the projection by said transferal aperture formed on said at least one stencil mask is performed.

6. A charged particle beam lithography apparatus as defined in claim 1, wherein characterized in that said control part controls one of said transfer mechanism and said charged particle beam deflector to move said other stencil mask so as to set the deflection range of the charged particle beam deflected by the charged particle beam deflector to the transferal aperture in said other stencil masks which should be projected next, while the projection by said transferal aperture formed on said at least one stencil mask is performed.

7. A charged particle beam lithography apparatus as defined in claim 1, wherein characterized in that said plurality of stencil masks are provided along an optical axis of said charged particle beam.

8. A charged particle beam lithography apparatus as defined in claim 1, wherein characterized in that said plurality of stencil masks are provided at a same height as an optical axis of said charged particle beam.

9. A charged particle beam lithography apparatus as defined in claim 1, wherein characterized in that said control part calculates a location error of said stencil mask based on output of said detector for detecting location of said stencil mask, and supplies a correction signal to the charged particle beam deflector based on said location error.

10. A charged particle beam lithography apparatus as defined in claim 1, wherein said control part repeatedly projects said electron beam onto said specimen surface through said transmission aperture of said at least one stencil mask and through said transferal aperture of said other stencil mask.

11. A charged particle beam lithography apparatus comprising:

a charged particle source to generate a charged particle beam, a plurality of stencil masks, each having several transferal apertures for respectively generating patterns to be projected on a specimen by said charged particle beam from said charged particle source, at least one of said stencil masks also including a transmission aperture, means for irradiating said particle beam on said specimen through said transmission aperture of said at least one of said stencil masks while said charged particle beam is also projected through a transferal aperture of another of said stencil masks.

* * * * *